(12) United States Patent
Park et al.

(10) Patent No.: US 6,716,732 B2  
(45) Date of Patent: Apr. 6, 2004

(54) METHOD FOR FABRICATING A CONTACT PAD OF SEMICONDUCTOR DEVICE

(75) Inventors: Young-rae Park, Suwon (KR); Jung-yup Kim, Seoul (KR); Bo-un Yoon, Seoul (KR); Sang-rok Hah, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/986,445

(22) Filed: Nov. 8, 2001

(65) Prior Publication Data

US 2002/0086509 A1 Jul. 4, 2002

(30) Foreign Application Priority Data

Nov. 10, 2000  (KR) .......................................... 2000-66828

(51) Int. Cl.[7] ...................... H01L 21/3205; H01L 21/44
(52) U.S. Cl. ........................ 438/586; 438/595; 438/669
(58) Field of Search ................................ 438/584, 586, 438/587, 595, 597, 598, 666, 669, 674, 684, 685

(56) References Cited

U.S. PATENT DOCUMENTS

| | | | | |
|---|---|---|---|---|
| 5,684,313 A | * | 11/1997 | Kenney | 257/296 |
| 6,071,802 A | * | 6/2000 | Ban et al. | 438/618 |
| 6,177,320 B1 | * | 1/2001 | Cho et al. | 438/279 |
| 6,380,042 B1 | * | 4/2002 | Huang | 438/303 |
| 6,511,919 B1 | * | 1/2003 | Park et al. | 438/723 |

* cited by examiner

Primary Examiner—Kamand Cuneo  
Assistant Examiner—Scott B. Geyer  
(74) Attorney, Agent, or Firm—Volentine Francos, PLLC

(57) ABSTRACT

A method of fabricating a contact pad of a semiconductor device is disclosed. The method includes forming a stopping layer over the semiconductor substrate. An interdielectric layer is formed over the stopping layer, and the interdielectric layer is planarized to expose at least a gate upper dielectric layer by using a material which exhibits a high-polishing selectivity with respect to the interdielectric layer. The interdielectric layer is etched in a region in which a contact pad will be formed on the semiconductor substrate. A conductive material is deposited on the semiconductor substrate. Finally, planarizing is carried out using a material which exhibits a high-polishing selectivity of the upper dielectric layer with respect to the conductive material.

20 Claims, 4 Drawing Sheets

METHOD FOR FABRICATING A CONTACT PAD OF SEMICONDUCTOR DEVICE

BACKGROUND OF THE INVENTION

1. Field of the Invention

The present invention relates generally to a method for manufacturing a semiconductor device, and more particularly, to a method for fabricating a contact pad of a semiconductor device.

2. Description of the Related Art

In the manufacturing process of memory devices in integrated circuits (IC), such as dynamic random access memory (DRAM) devices and static random acess memory (SRAM) devices, an electrically conductive material layer, called a contact pad, may be formed for establishing an electrical connection between a bit line and a drain, and an electrical connection between a capacitor and a source. Advantageously, the contact pad increases an area contacted in the electric connection between the bit line and the drain, and the electric connection between the capacitor and the source.

FIGS. 1 through 4 are drawings illustrating a conventional method for forming a contact pad of a semiconductor device.

Referring to FIG. 1, a gate structure 20 is formed on a semiconductor substrate 10 on which a device 12 is formed. The gate structure 20 is formed of a gate electrode 26, a silicide layer 24, a gate upper dielectric layer 22, and a gate spacer 28. A stopping layer 14 is formed at a substantially constant thickness along the surface of the semiconductor substrate, and an interdielectric layer 16 is deposited over the entire surface of the semiconductor substrate. Then, the interdielectric layer 16 is planarized by a chemical mechanical polishing (CMP) process or a reflow process. Usefully, the CMP allows a thickness of the interlayer dielectric 16 equal to or more than 1000 Å ("T1" in FIG. 1) to remain on the gate upper dielectric layer 22 in order to prevent an upper portion of the gate upper dielectric layer 22 from being damaged.

Referring to FIG. 2, an anti-reflective layer 18 is disposed over the interdielectric layer 16, and a patterned photoresist 30 is formed on the anti-reflective layer 18 for etching the contact pad.

Referring to FIG. 3, a portion of interdielectric layer 16 is etched and removed by a self aligned contact (SAC) using the patterned photoresist 30 as an etching mask, forming a lower interdielectric layer 16A. This forms a region in which a contact pad will be formed. A remaining portion 14A of the stopping layer 14 is used as an etch-stop for the SAC etching; and some part of the remaining portion 14A of stopping layer is further removed. A conductive material 34, for example, polysilicon, is deposited on which the stopping layer 14A is removed, filling the region 32 in which a control pad will be formed. Dry etching is performed again for easy operation of the following CMP process, and the deposited conductive material 34 for the contact pad, and the lower interdielectric layer 16A are etched back to a prescribed thickness ("T2" of FIG. 3).

Referring to FIG. 4, the CMP process is performed, and contact pads 34' separated by gate structures 20 are formed. Here, the stopping layer 14B and the gate upper dielectric layer 22 act as a polishing stopper during the CMP process of the polished lower interdielectric layer 16B.

However, the method for fabricating a contact pad of a semiconductor device according to the conventional art has certain drawbacks.

For example, the process is rather complex. Moreover, part of the gate upper dielectric layer 22 is consumed by polishing or etching during the CMP process for manufacturing the contact pad. This may result in shorting of the contact pad 34' and the silicide 24. This ultimately will result in shorting of the gate and bit line of the semiconductor device.

Finally, in order to prevent the gate upper dielectric layer from becoming too thin, a relatively thick gate upper dielectric layer 22 may be formed. As such, the thickness of the interdielectric layer 16 must be increased. An increase in the thickness of the interdielectric layer may result in the undesirable formation of voids within the interdielectric layer.

What is needed, therefore, is a method of fabricating a contact pad which overcomes the drawbacks of conventional techniques such as described above.

SUMMARY OF THE INVENTION

According to an illustrative embodiment of the present invention, a method of fabricating a contact pad of a semiconductor device includes forming a gate structure including a gate upper dielectric layer on a semiconductor substrate; forming a stopping layer over the semiconductor substrate; forming an interdielectric layer over the stopping layer; planarizing the interdielectric layer to expose at least the gate upper dielectric layer using a material which exhibits a high-polishing selectivity with respect to the interdielectric layer; etching the interdielectric layer in a region in which a contact pad will be formed on the semiconductor substrate; depositing a conductive material on the semiconductor substrate; and planarizing using a material which exhibits a high-polishing selectivity of the gate upper dielectric layer with respect to the conductive material.

Advantageously, in the CMP process for planarizing the interdielectric layer and the conductive material for the contact pad according to an illustrative embodiment of the present invention, because a slurry is used which gives a high polishing selectivity of the interdielectric layer with respect to the conductive material for the contact pad to the gate upper dielectric layer, the process can be simplified, and the loss in thickness of the gate upper dielectric layer can be minimized. As such, electrical shorting of the gate and the bit line can be prevented, and the process margin can be improved. Also, since the thickness of the interdielectric layer can be reduced by reducing the thickness of the gate upper dielectric layer, the occurrence of voids can be suppressed.

BRIEF DESCRIPTION OF THE DRAWINGS

The invention is best understood from the following detailed description when read with the accompanying drawing figures. It is emphasized that the various features are not necessarily drawn to scale. In fact, the dimensions may be arbitrarily increased or decreased for clarity of discussion.

DETAILED DESCRIPTION

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Figure 1:
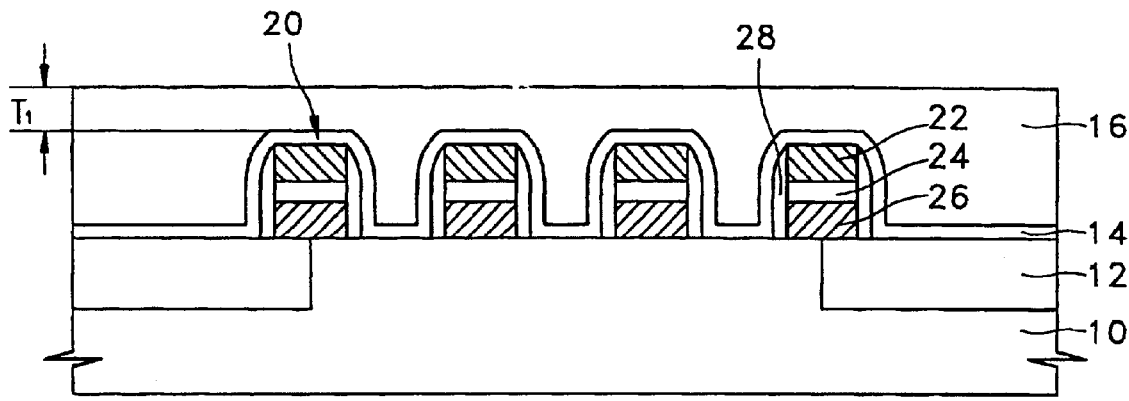
FIGS. 1 through 4 are sectional views illustrating a method for fabricating a contact pad of a semiconductor device according to a conventional technology.
Figure 2:
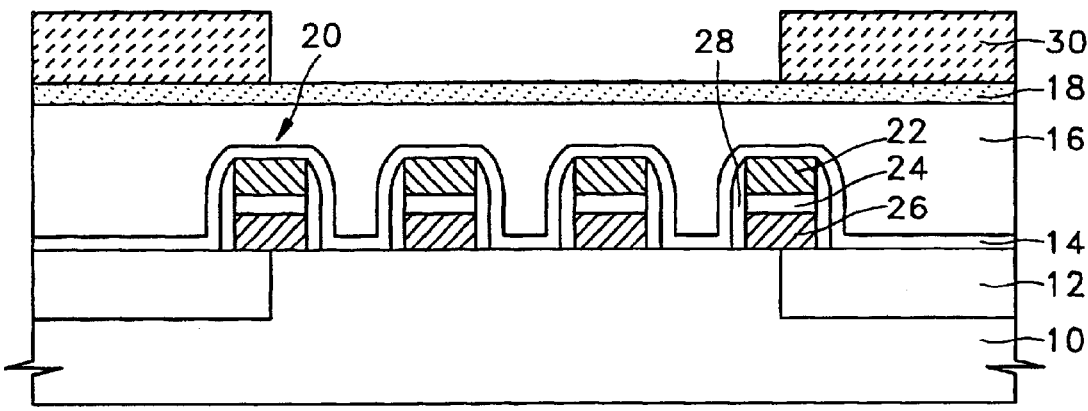
Figure 3:
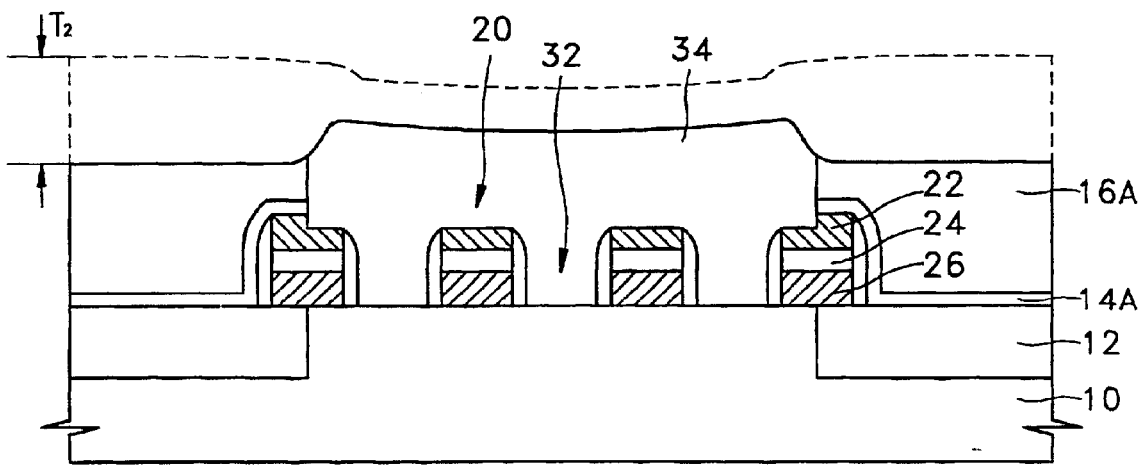
Figure 4:
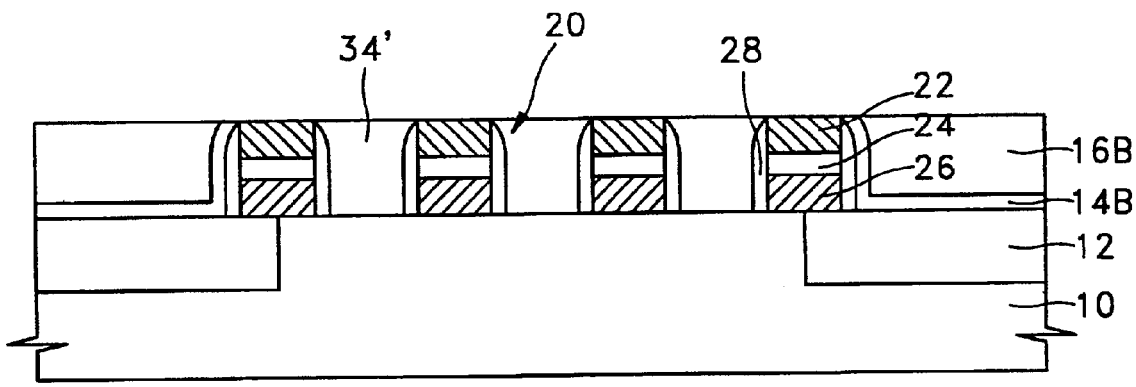
Figure 5:
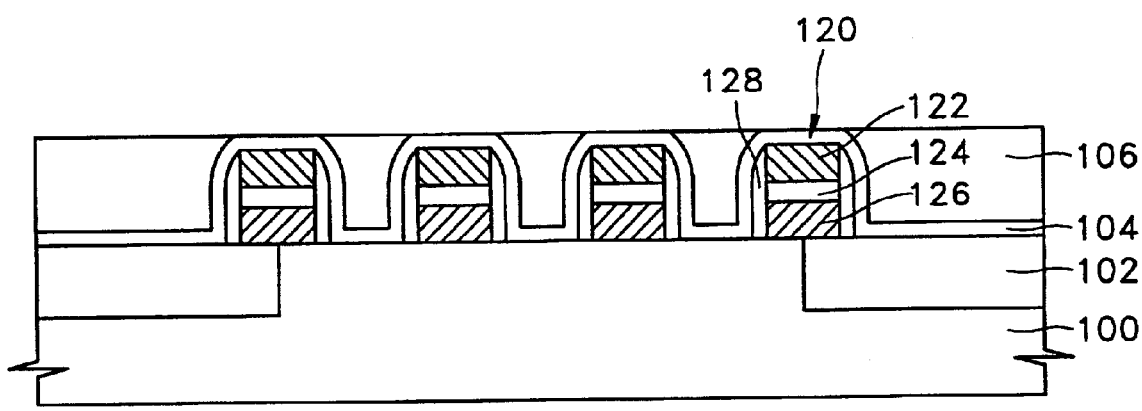
FIGS. 5 through 8 are sectional views illustrating a method for fabricating a contact pad of a semiconductor device according to the present invention.

Referring to FIG. 5, a gate structure 120 is formed on a semiconductor substrate 100 on which a device separating layer 102 is formed. The described gate structure 120 is illustratively formed of a gate electrode 126 of polysilicon, a silicide layer 124 of tungsten silicide ($WSi_x$) over the gate electrode 126, a gate upper dielectric layer 122 (e.g. a nitride layer, or an oxide aluminum layer ($Al_2O_3$)) over the silicide layer 124, and a gate spacer 128 of a nitride layer on the side walls of the gate electrode 126, the silicide layer 124, and the gate upper dielectric layer 122.

It is useful to form the gate upper dielectric layer 122 to an illustrative thickness in the range of approximately 1500 Å and 2500 Å; and particularly to a thickness of 2000 Å. Next, a stopping layer 104, for example, a nitride layer, is formed over the semiconductor substrate 100 by blanket deposition. Illustratively, the thickness of the stopping layer 104 is in the range of approximately 50 Å and 150 Å. Next, an interdielectric layer 106 is deposited over the stopping layer 104. The interdielectric layer 106 is illustratively a high density plasma oxide layer (HDP Oxide), a spin-on-glass (SOG) layer, a boron phosphorous silicate glass (BPSG) layer, a phosphorous silicate glass (PSG) layer, an undoped silicate glass (USG) layer, a plasma enhanced tetra ethyl ortho silicate glass (PE-TEOS) layer, a flowable oxide (FOX) layer, a photoresister layer, or a polymer layer. The deposited interdielectric layer 106 may be planarized by reflowing.

Illustratively, when a chemical mechanical polishing (CMP) process is performed on the interdielectric layer 106, the gate upper dielectric layer 122 or the stopping layer 104 may be used as a polishing stopping layer for planarization. The interdielectric layer 106 can be relatively thin compared to the thickness of those required for conventional techniques describe above. The method for planarizing according to the illustrative embodiment of the present invention is performed using a slurry including abrasive particles which exhibit a polishing selectivity of the interdielectric layer 106 with respect to the gate upper dielectric layer 122 in the range of approximately 5:1 to approximately 50:1. Alternatively, planarizing can be performed by a dry etching method which exhibits an etch selectivity of the interdielectric layer 106 with respect to the gate upper dielectric layer 122 in the range of approximately 5:1 to approximately 50:1. That is, the planarization process is performed using a material which exhibits a high polishing selectivity relative to the material used for interdielectric layer 106; and which exhibits a low etching selectivity or a low polishing selectivity with respect to the gate upper dielectric layer 122, which is illustratively a nitride. The slurry may be alumina, silica, ceria, or $Mn_2O_3$ particles. In the illustrative embodiment a slurry of a ceria base is used.

Figure 6:
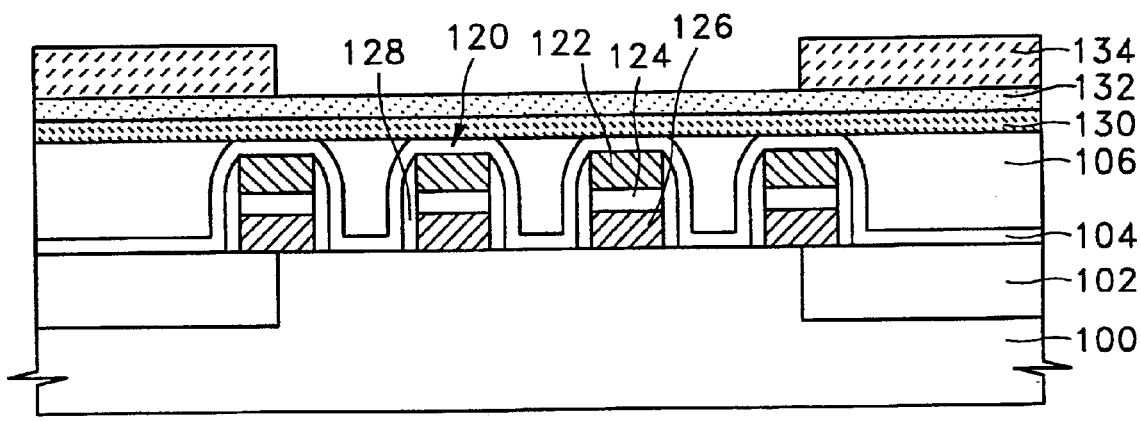

Referring to FIG. 6, an etch buffering layer 130 is formed to a thickness equal to or less than approximately 1000 Å using the same material as the conductive layer for the contact pad over the substrate as shown. For example, buffering layer 130 may be a polysilicon layer. The etch buffering layer 130 performs a role of etch buffering in the following planarization process for forming the contact pad. Moreover, etch buffering layer 130 enables the contact pad to be formed in one step by a CMP process. To minimize the CMP process time, the thickness is usefully formed to be equal to or less than approximately 1000 Å. In contrast, according to the conventional art described above, the CMP process is formed of two steps of the etchback process such as dry etching and the CMP process. However, according to the illustrative embodiment of present invention, the CMP process for forming the contact pad can be reduced to one step by using the etch buffering layer 130.

An anti-reflective layer 132 is formed over the etch buffering layer 130, and a photoresist pattern 134 is formed. Photoresist pattern 134 is formed in the region where the contact pad is formed. It is useful to use an amorphous carbon layer for the anti-reflective layer 132. This is because it is economical to manufacture the amorphous carbon layer, and the anti-reflective layer is removed with the photoresist pattern, so that an additional process for removing the anti-reflective layer 132 is not necessary.

Figure 7:
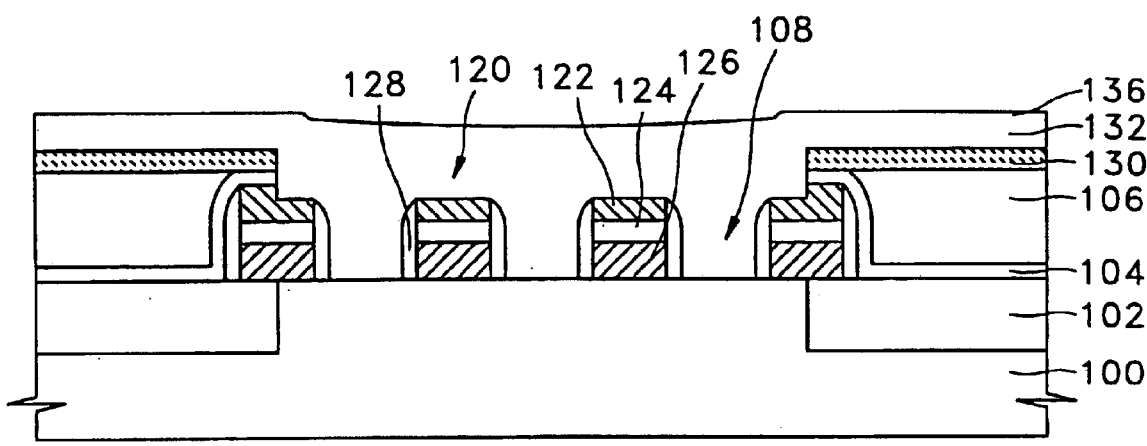

Referring to FIG. 7, self aligned contact (SAC) etching is performed using the photoresist pattern 134 as an etching mask. Illustratively, a part of the interdielectric layer 106 of the region in which the contact pad will be formed 108 is removed by a conventional dry etching method. Thereafter, a part of the stopping layer 104 exposed to the region in which the contact pad will be formed 108 is removed by dry etching. In the above process, the anti-reflective layer 132 is removed with the photoresist pattern 134.

The conductive material 136 for the contact pad (e.g. doped polysilicon) is deposited to cover the entire surface of the semiconductor substrate on which the region in which the contact pad will be formed 108 is etched. Illustratively, the conductive material 136 for the contact pad can also be titanium, titanium nitride, and tungsten.

According to the conventional process described above, dry etching is first performed and the conductive material 136 for the contact pad and some of the interdielectric layer are etched back. This is done to minimize the removal of the gate upper dielectric layer 122 by polishing in the following CMP process. This may also improve the uniformity of the CMP. However, in accordance with the illustrative embodiment of the present invention, this process is not necessary.

Figure 8:
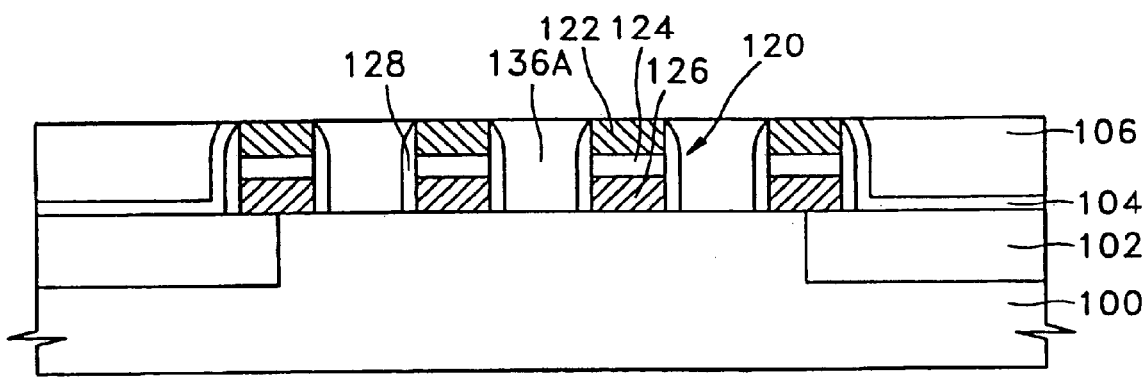

Referring to FIG. 8, the planarization process is performed. This planarization process results in the formation of contact pad 136A from conductive materal 136.

In the illustrative embodiment, if the chosen method for planarizing is a CMP process, a slurry is used which exhibits a high-polishing selectivity of the gate upper dielectric layer 122 over the conductive material 136 for the contact pad 136A, polysilicon. Illustratively, this etch selectivity is in the range of approximately 1:5 to approximately 1:50. The slurry can include abrasive particles such as alumina, silica, ceria and $Mn_2O_3$. Advantageously, planarization can be easily achieved without dishing on the contact pad having a shape separated by one CMP process.

Therefore, according to the illustrative embodiment of the present invention, the process for forming the contact pad is simplified compared to the conventional technique described above. Moreover, the loss of the upper portion of the gate upper dielectric layer 122 by polishing or etching can be suppressed by using a slurry having a high polishing ratio.

The planarization process in accordance with the illustrative embodiment can be carried out, not only through the described CMP process, but also through dry etching. If the etching selectivity of the gate upper dielectric layer 122 relative to the conductive material 136 used for the contact pad 136A is in the range of approximately 1:5 to approximately 1:50, the planarizing process may be performed using dry etching. The illustrative method for fabricating the contact pad of the semiconductor device according to the present invention can be applied to DRAM, SRAM, and merged DRAM logic device (MDL), wherein the gate pattern and the contact pad are formed inside the semiconductor device.

Figure 9:
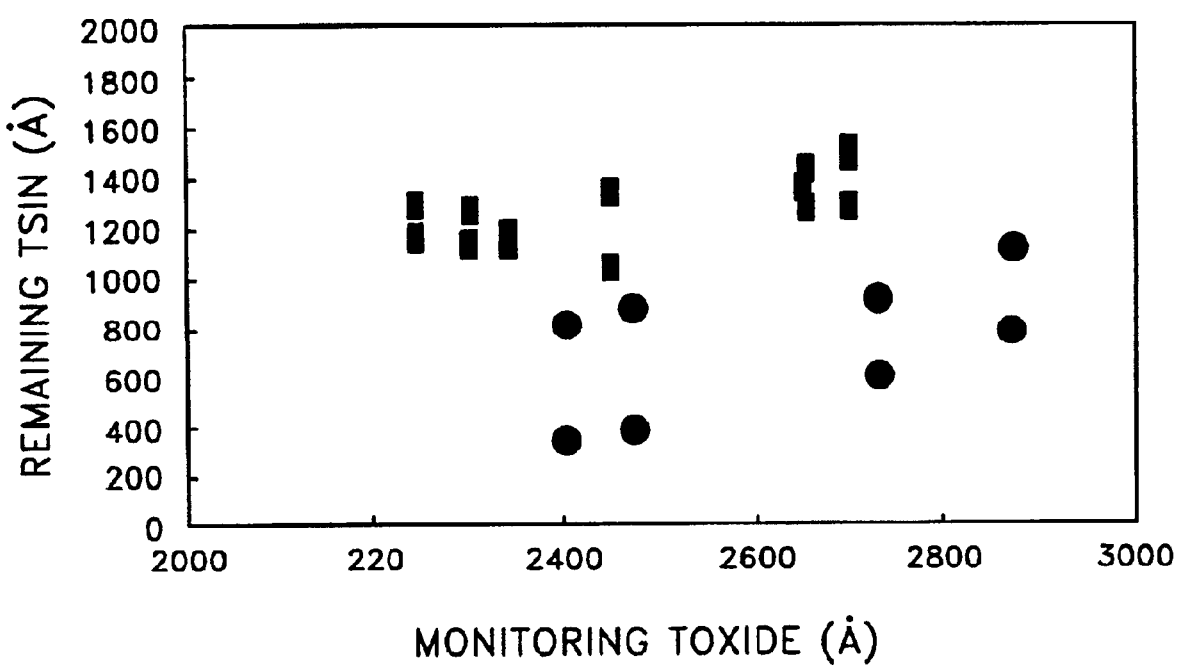
FIG. 9 is a graph illustrating the consumption of a gate upper dielectric layer when a contact pad of a semiconductor is formed according to the present invention.

FIG. 9 is a graph illustrating the loss of the gate upper dielectric layer when the contact pad of the semiconductor device is formed according to the present invention.

Referring to FIG. 9, after the gate upper dielectric layer 122 is formed to a thickness of approximately 2000 Å, the conductive material 136 for the contact pad is planarized, and the measured thickness of the gate upper dielectric layer is as shown. The abscissa of the graph indicates the thickness of the interdielectric layer formed of oxide, and the ordinate indicates the remaining thickness of the gate upper dielectric layer, the nitride layer.

In the graph, the symbol "■" indicates the thickness of the gate upper dielectric layer measured after forming the contact pad of the semiconductor device according to the exemplary embodiment as shown in FIGS. 5 through 8, and the symbol " " indicates the thickness of the gate upper dielectric layer measured after manufacturing the contact pad of the semiconductor device according to the conventional art as shown in FIGS. 1 through 4.

On the whole, in the case of forming the contact pad according to the present invention, about 500 Å less of the gate upper dielectric layer is removed than in the case of forming the contact pad of the semiconductor device according to the conventional art process.

Finally, as can be appreciated, the above description is merely illustrative of the invention. As such, the present invention can be embodied in different ways without departing from the spirit and essential features of the invention. For example, in the above described illustrative embodiment, an anti-reflective layer is an amorphous carbon layer, but it can be an organic anti-reflective layer such as an oxide nitride layer (SiON). Also, in the above described illustrative embodiment, a slurry used for polishing the interdielectric layer using a high polishing selectivity of a gate upper dielectric layer to the interdielectric layer has a ceria base, but the ceria base can be replaced with a silica base or a slurry including abrasive particles of alumina and $Mn_2O_3$. Also, a slurry used for polishing a conductive material for a contact pad using a high polishing selectivity of the gate upper dielectric layer and the conductive material for the contact pad has a silica base, but the silica base can be replaced with a ceria base, or a slurry including abrasive particles of alumina and $Mn_2O_3$. Of course, other variations and modifications in keeping with the teaching of the present invention are possible.

From the result, the following can be inferred:

Because the consumption of the gate upper dielectric layer can be reduced, shorting (short-circuiting) of the gate and the bit line can be substantially reduced and the process margin can be improved. Because the removal of the gate upper dielectric layer is small, the height of the entire gate structure 120 as shown in FIG. 5 can be lowered compared to structures formed by conventional techniques, and the thickness of the interdielectric layer can be reduced, so that the occurrence of voids inside the interdielectric layer can be suppressed.

Since in the planarization process for the interdielectric layer, and the planarization process for forming the contact pad, the loss of the thickness of the gate upper dielectric layer can be restrained, short-circuiting of the gate and the bit line can be prevented and the process margin can be improved.

Since the thickness of the interdielectric layer can be reduced, the occurrence of voids inside the interdielectric layer can be planarized.

In the planarization process for forming the contact pad, dishing generated on the surface of the contact pad can be substantially prevented.

The invention being thus described, it would be obvious that the same way may be varied by one having ordinary skill in the art having had the benefit of the present disclosure. Such variations are not regarded as a departure of the spirit and scope of the invention, and such modifications as would be obvious to one skilled in the art are intended to be included within the scope of the following claims and their legal equivalents.

What is claimed is:

1. A method of fabricating a contact pad of a semiconductor device, the method comprising:
    (a) forming a gate structure including a gate upper dielectric layer on a semiconductor substrate;
    (b) forming a stopping layer over the semiconductor substrate;
    (c) forming an interdielectric layer over the stopping layer;
    (d) planarizing the interdielectric layer to expose at least the gate upper dielectric layer using a material which exhibits a high-polishing selectivity with respect to the interdielectric layer;
    (e) etching the interdielectric layer in a region in which a contact pad will be formed on the semiconductor substrate;
    (f) depositing a conductive material for the contact pad on the semiconductor substrate; and
    (g) planarizing using a material which exhibits a high-polishing selectivity of the gate upper dielectric layer with respect to the conductive material.

2. The method of claim 1, wherein the gate upper dielectric layer is one selected from the group consisting essentially of a silicon nitride layer (SiN) and an aluminum oxide layer ($Al_2O_3$).

3. The method of claim 1, wherein the thickness of the gate upper dielectric layer is in the range of approximately 1500 Å and 2500 Å.

4. The method of claim 1, wherein the stopping layer is a silicon nitride layer (SiN).

5. The method of claim 1, wherein the thickness of the stopping layer is in the range of approximately 50 Å and 150 Å.

6. The method of claim 1, wherein the interdielectric layer is dielectric layer selected from the group consisting of a polymer, a high density plasma oxide layer, a plasma enhanced tetra ethyl ortho silicate glass layer, a undoped silicate glass layer, a boron phosphorous silicate glass layer, a phosphorous silicate glass layer, a flowable oxide layer, and a photoresist layer.

7. The method of claim 1, wherein a process for planarizing the interdielectric layer is further performed after the depositing of the interdielectric layer.

8. The method of claim 1, wherein planarizing of (d) is performed using a process chosen from the group consisting essentially of chemical-mechanical polishing and dry etching.

9. The method of claim 8, wherein the CMP is performed using a slurry which exhibits a polishing selectivity of the gate upper dielectric layer with respect to the interdielectric layer in the range of approximately 1:5 to approximately 1:50.

10. The method of claim 9, wherein the slurry includes abrasive particles selected from the group consisting essentially of alumina, silica, ceria, and manganese oxide ($Mn_2O_3$).

11. The method of claim 1, wherein an etch buffering layer is formed on the entire surface of the planarized semiconductor substrate is further performed after (d).

12. The method of claim 11, wherein an anti-reflective layer is formed on the semiconductor substrate on which the etch buffering layer is formed.

13. The method of claim 12, wherein the anti-reflective layer includes amorphous carbon layer.

14. The method of claim 11, wherein the etch buffering layer is formed of the same material as the conductive material.

15. The method of claim 11, wherein the thickness of the etch buffering layer is in the range of approximately 500 Å and 1500 Å.

16. The method of claim 1, wherein an exposed portion of the stopping layer is etched after (e).

17. The method of claim 1, wherein the conductive material for the contact pad is one chosen from the group consisting of polysilicon, titanium (Ti), nitride titanium (TiN), and tungsten (W).

18. The method of claim 1, wherein planarizing of (g) is performed from a process chosen from the group consisting essentially of dry etching and CMP.

19. The method of claim 18, wherein the CMP process is performed using a slurry which exhibits a polishing selectivity of the gate upper dielectric layer with respect to the conductive material in the range of approximately 1:5 to approximately 1:50.

20. The method of claim 19, wherein the slurry includes abrasive particles selected from the group consisting essentially of alumina, silica, ceria, and $Mn_2O_3$.

* * * * *